(12) United States Patent
Saka (10) Patent No.: US 7,367,819 B2
(45) Date of Patent: May 6, 2008

(54) BOARD MOUNTED TERMINAL CONSTRUCTION

(75) Inventor: Yukinori Saka, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 6 days.

(21) Appl. No.: 11/548,794

(22) Filed: Oct. 12, 2006

(65) Prior Publication Data

US 2007/0202719 A1    Aug. 30, 2007

(30) Foreign Application Priority Data

Feb. 27, 2006    (JP)    ............................. 2006-050083

(51) Int. Cl.
*H01R 12/00*    (2006.01)
(52) U.S. Cl. ........................ 439/82; 439/76.2; 439/567
(58) Field of Classification Search ............ 439/82–83, 439/76.2, 566–567
See application file for complete search history.

(56) References Cited

U.S. PATENT DOCUMENTS

| | | | |
|---|---|---|---|
| 5,761,050 A * | 6/1998 | Archer | ........................ 361/791 |
| 6,643,134 B2 | 11/2003 | Ashiya et al. | |
| 6,671,173 B2 | 12/2003 | Ashiya et al. | |
| 6,942,499 B2 | 9/2005 | Tanaka et al. | |
| 6,963,494 B2 * | 11/2005 | Mickievicz et al. | ........ 361/795 |
| 2002/0039846 A1 * | 4/2002 | Lazaro et al. | .................. 439/34 |

FOREIGN PATENT DOCUMENTS

| JP | 2003-272737 | 9/2003 |
|---|---|---|
| JP | 2005-135698 | 5/2005 |

OTHER PUBLICATIONS

English Language Abstract of JP 2005-135698.
English Language Abstract of JP 2003-272737.

* cited by examiner

*Primary Examiner*—Truc Nguyen
(74) *Attorney, Agent, or Firm*—Greenblum & Bernstein, P.L.C.

(57) ABSTRACT

A terminal has a plurality of split solder portions inserted into through-holes in a printed circuit board. A first split solder portion has a cross-sectional shape such that four corners thereof contact an inner circumferential surface of the through hole for positioning, while a second split solder portion has a cross-sectional shape such that the portion is loosely inserted into the through hole without contacting an inner circumferential surface thereof. The plurality of split solder portions of the terminal are inserted into through holes having substantially equal diameters. The four corners of the first split solder portion contact the inner circumferential surface of the through hole for positioning and holding. The second split solder portion does not contact the inner circumferential surface of the through hole. The through holes are filled with solder to fix the split solder portions therein.

20 Claims, 6 Drawing Sheets

BOARD MOUNTED TERMINAL CONSTRUCTION

CROSS-REFERENCE TO RELATED APPLICATIONS

The present disclosure relates to subject matter contained in priority Japanese Application No. 2006-050083, filed on Feb. 27, 2006, which is herein expressly incorporated by reference in its entirety.

BACKGROUND OF THE INVENTION

1. Field of the Invention

The present invention relates to a terminal directly mounted on a printed circuit board, a construction to directly mount a terminal to a printed circuit board, a printed circuit board to which a terminal is directly mounted, and an electric junction box that houses a printed circuit board or a printed circuit board on which a terminal is directly mounted. More particularly, the present invention relates to a terminal that is inserted in a through hole in a printed circuit board and soldered to the through-hole, and the terminal is positioned and fixed to the printed circuit board in a simple and secure manner without damage, thus enhancing alignment accuracy of the terminal.

2. Description of Related Art

Conventionally, terminals directly mounted on a printed circuit board include a press-fit terminal, which is pressed into a through-hole in a board and press-contacted on a conductor coated on an inner circumferential surface of the through-hole for connection; and a terminal that is inserted into a through-hole in a printed circuit board and soldered for connection with a circuit. The prior art also includes a terminal that includes an end portion split into a plurality of board connecting portions that are inserted into through-holes in a printed circuit board. The board connecting portions are inserted into respective through holes provided in the printed circuit board and soldered for electric connection.

Figure 5A:
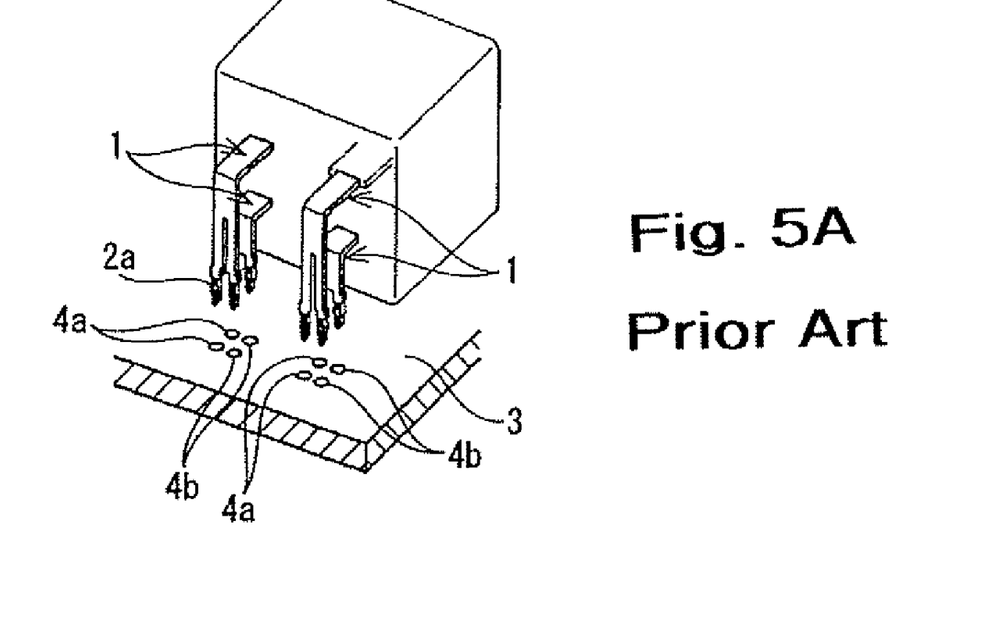
FIGS. 5A and 5B illustrate a conventional example of a terminal mounted on a printed circuit board.
Figure 5B:
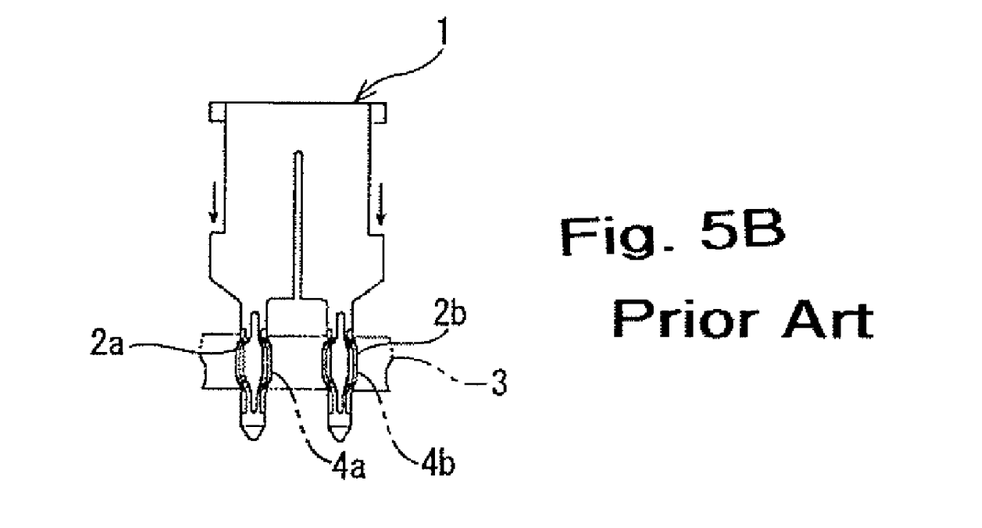
Figure 6A:
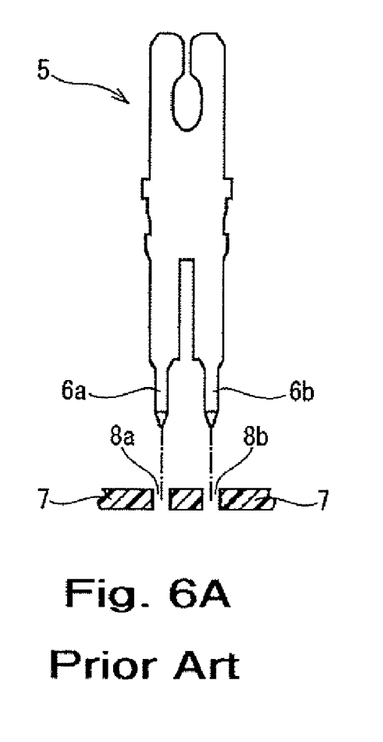
FIGS. 6A, 6B, and 6C illustrate a conventional example of a terminal mounted on a printed circuit board.
Figure 6B:
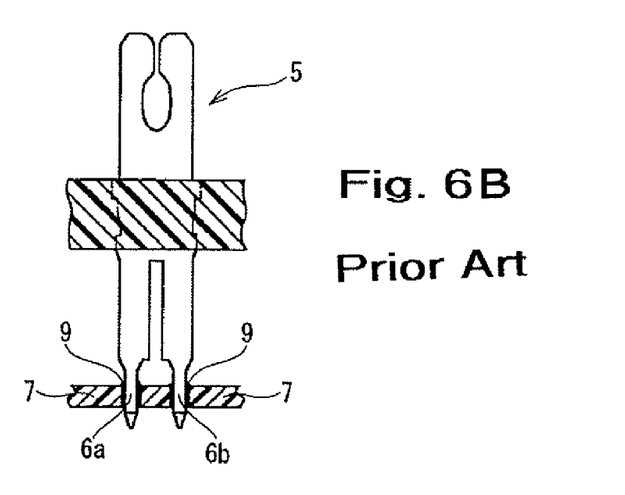
Figure 6C:
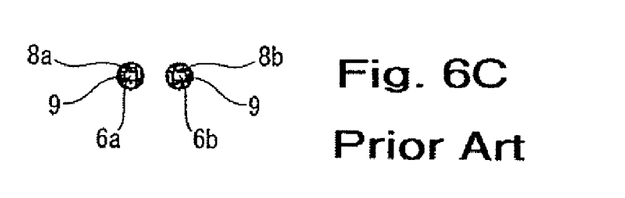

For example, Japanese Patent Laid-open Publication No. 2005-135698 discloses a press-fit terminal 1, as shown in FIGS. 5A and 5B. The press-fit terminal 1 includes an end portion split into two board connecting portions 2a and 2b, which are press-fit into printed circuit board 3 through holes 4a and 4b, respectively. The through holes 4a, 4b each include an inner wall plated with a conductor. Further, Japanese Patent Laid-open Publication No. 2003-272737 discloses a terminal 5 for high current, as shown in FIGS. 6A and 6B. The terminal 5 includes an end portion split into two board connecting portions 6a and 6b, which are inserted into printed circuit board 7 through holes 8a and 8b, respectively. The through holes 8a, 8b each include an inner wall plated with a conductor. Spaces between the through holes 8a, 8b and the board connecting portions 6a, 6b are filled with solder 9 for connection with a circuit on the printed circuit board 7.

However, the conductor on the inner wall of the through holes 4a, 4b is easily scratched when the press-fit terminal 1 is pressed in, thus causing a conduction failure in both board connecting portions 2a and 2b. Further, after insertion into the through holes 8a, 8b, the terminal 5 is pressed from above and held by a jig until soldered, thus easily causing terminal misalignment or deformation and requiring alignment adjustment. These problems associated with the prior art are not limited to high current terminals, but also occur in press-fit terminals and solder-mounted terminals that include a terminal connecting portion that is not split.

SUMMARY OF THE INVENTION

The present invention is provided to address the above-described problems. An object of the present invention is to improve stability of the electric connection between a terminal and a printed circuit board, and to improve accuracy of terminal alignment so as to eliminate alignment adjustment, when the terminal is directly mounted on the printed circuit board.

An aspect of the present invention provides a terminal directly mounted on a printed circuit board by insertion in through holes in the printed circuit board, the terminal including a solder portion inserted in through holes in the board, the solder portion being split into a plurality of portions; the plurality of portions including a first split solder portion having a cross-sectional shape including four corners contacting an inner circumferential surface of a first through hole for positioning; and a second split solder portion having a cross-sectional shape such that the second split solder portion is loosely inserted in a second through hole without contacting an inner circumferential surface of the through hole. The terminal directly mounted on a printed circuit board may further include solder filled in the first through hole and fixing the first split solder portion to the inner circumferential surface of the first through hole; and solder filled in the second through hole and fixing the second split solder portion to the inner circumferential surface of the second through hole.

In a further aspect of the present invention, the first through hole has a first diameter and the second through hole has a second diameter substantially equal to the first diameter; and the first split solder portion is positioned and held in the first through hole by the four corners contacting the inner circumferential surface of the first through hole; and the second split solder portion is spaced from and not contacting the inner circumferential surface of the second through hole.

In a further aspect of the present invention, the second split solder portion has a cross-sectional shape substantially the same as the shape of the first split solder portion; the first through hole has a first diameter such that the four corners of the first split solder portion contact the inner circumferential surface of the first through hole for positioning; and the second through hole has a second diameter greater than the first diameter such that the second split solder portion is loosely inserted in the second through hole and does not contact the inner circumferential surface of the second through hole.

Further, the first split solder portion may be press fit in the first through hole. The a diagonal length of the cross-section of the first solder portion may be substantially equal to the first diameter of the first through hole; and the diagonal length of the cross-section of the first solder portion may be greater than a diagonal length of the cross-section of the second solder portion. The a diagonal length of the cross-section of the first solder portion may be substantially equal to the first diameter of the first through hole; and the diagonal length of the cross-section of the first solder portion may be substantially equal to a diagonal length of the cross-section of the second solder portion. Further, the terminal directly mounted on a printed circuit board may be housed in an electrical junction box.

A further aspect of the present invention provides a connection for directly mounting a terminal on a printed circuit board by insertion in through holes in the printed circuit board, the connection including a terminal solder portion inserted in through holes in the board, the solder portion being split into a plurality of portions; the plurality of portions including a first split solder portion having a cross-sectional shape including four corners contacting an inner circumferential surface of a first through hole for positioning; and a second split solder portion having a cross-sectional shape such that the second split solder portion is loosely inserted in a second through hole without contacting an inner circumferential surface of the second through hole.

A further aspect of the present invention provides a method of directly mounting a terminal on a printed circuit board by insertion in through holes in the printed circuit board, the method including providing a terminal solder portion to be inserted in through holes in the board, the solder portion being split into a plurality of portions; the plurality of portions including a first split solder portion having a cross-sectional shape including four corners configured to contact an inner circumferential surface of a first through hole for positioning; and a second split solder portion having a cross-sectional shape configured to be loosely inserted in a second through hole without contacting an inner circumferential surface of the second through hole; inserting the first split solder portion in the first through hole such that the first split solder portion is positioned and held in the first through hole by the four corners contacting the inner circumferential surface of the first through hole; and inserting the second split solder portion in the second through hole such that the second split solder portion does not contact the inner circumferential surface of the second through hole.

BRIEF DESCRIPTION OF THE DRAWINGS

The above, and other objects, features, and advantages of the present invention will be made apparent from the following description of the preferred embodiments, given as nonlimiting examples, with reference to the accompanying drawings in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are described with reference to the drawings. FIGS. 1 through 3C illustrate an electric junction box 10 according to a first embodiment of the present invention. The electric junction box 10 may be mounted in, for example, a vehicle. The electric junction box 10 is connected to a wire harness (not shown in the drawings). A lower cover 11 houses a plurality of printed circuit boards. The present invention may include any suitable number of printed circuit boards, and in the present embodiment includes two printed circuit boards including an upper printed circuit board 20 and a lower printed circuit board 20 therein. Terminals 30 are directly mounted with soldering to the printed circuit boards 20. An upper cover 12 covers an upper opening of the lower cover 11. A latch hook 14 on the upper cover 12 locks into a latch receiver 13 on the lower cover 11.

Figure 1:
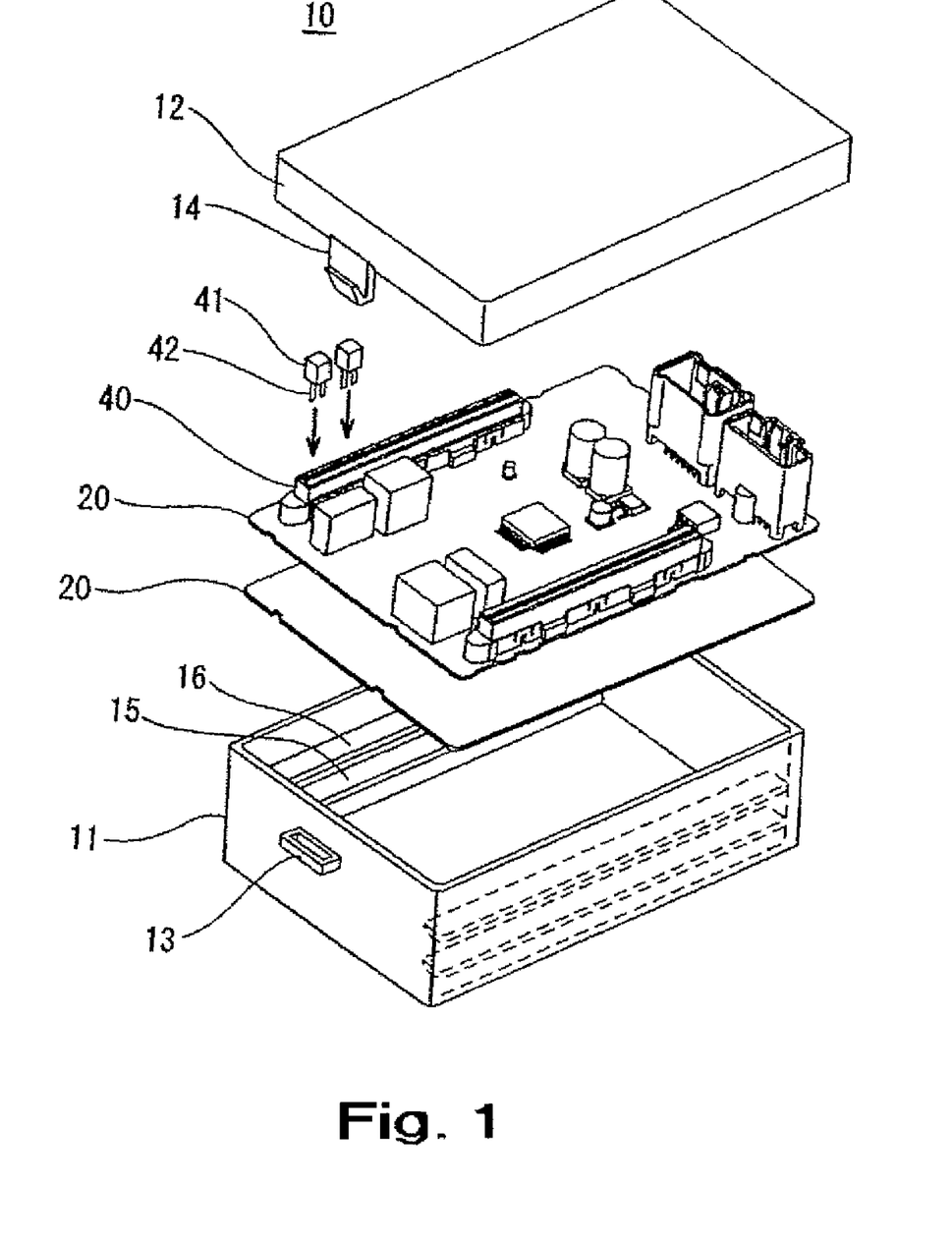
FIG. 1 is an exploded perspective view of an electric junction box according to a first embodiment of the present invention.
Figure 2:
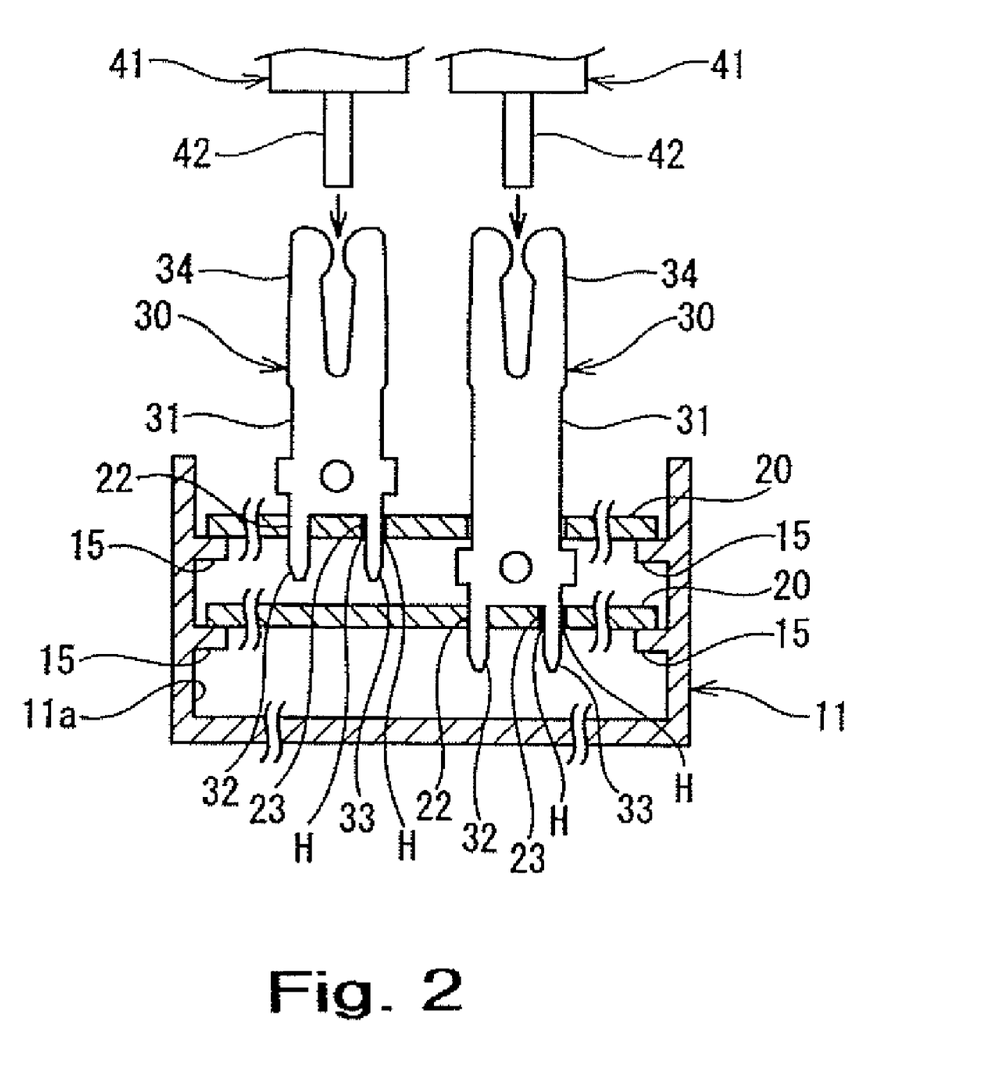
FIG. 2 is a cross-sectional view illustrating the electric junction box of FIG. 1 and showing stack of printed circuit boards.

As shown in FIG. 2, each terminal 30 includes a body 31 having a substantially rectangular planar shape. A first end portion of the terminal 30 is split into two split solder portions, a first split solder portion 32 and a second split solder portion 33. The first and second split solder portions 32, 33 are substantially parallel to each other with a space therebetween. The first and second split solder portions 32, 33 project from the body 31 of the terminal 30. The first split solder portion 32 has a relatively wide width and a cross-sectional shape such that four corners thereof contact an inner circumferential surface of a through hole 22 (hereinafter described) in the printed circuit board 20 for positioning. The second split solder portion 33 has a relatively narrow width and a cross-sectional shape such that the second split solder portion 33 is inserted with a loose fit into a through hole 23 (hereinafter described) in the printed circuit board 20, without contacting an inner circumferential surface of the through hole 23. A second end portion of the body 31 is provided with a pronged connecting terminal portion 34 that projects in a direction opposite to the direction in which the first and second split solder portions 32, 33 project.

The printed circuit boards 20 are supported respectively from a bottom surface thereof by support portions 15. The support portions 15 project from inner walls 11a of the lower case 11 in a horizontal direction as shown in FIG. 2. The printed circuit boards 20 are stacked vertically with a predetermined space therebetween.

Figure 3A:
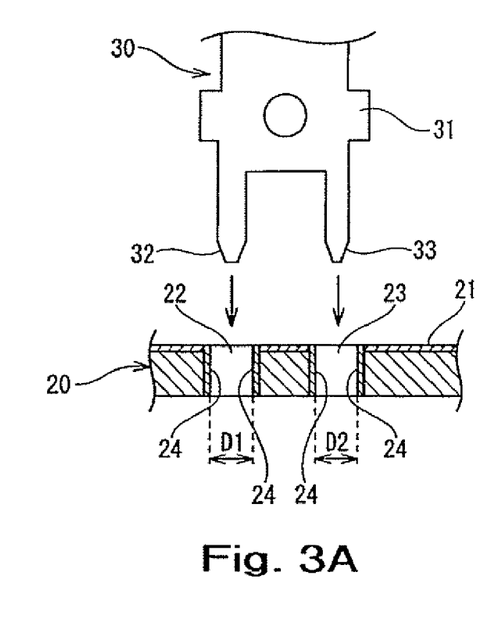
FIG. 3A is a cross-sectional view illustrating the insertion of a terminal into a printed circuit board of the electric junction box of FIG. 1, in a direct-mount operation.

As shown in FIG. 3A, a conductor 21 is provided along a circuit pattern on a surface of the printed circuit board 20. At a location for attaching the terminal 30 on the conductor 21, two through-holes 22 and 23 are provided corresponding to the two split solder portions 32 and 33, respectively. The inner circumferential surface of the through-holes 22 and 23 is plated with a conductor 24 connected with the conductor 21 on the printed circuit board 20.

Figure 3B:
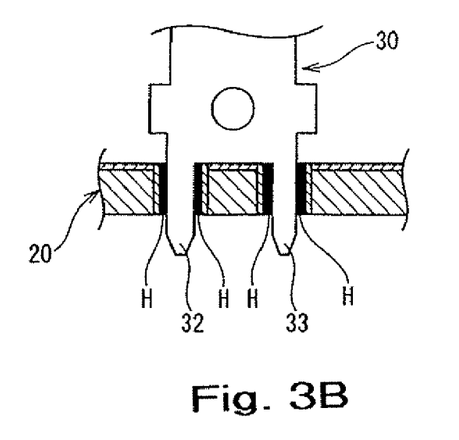
FIG. 3B is a cross-sectional view illustrating the terminal soldered to the printed circuit board of the electric junction box of FIG. 1 in the direct-mount operation.
Figure 3C:
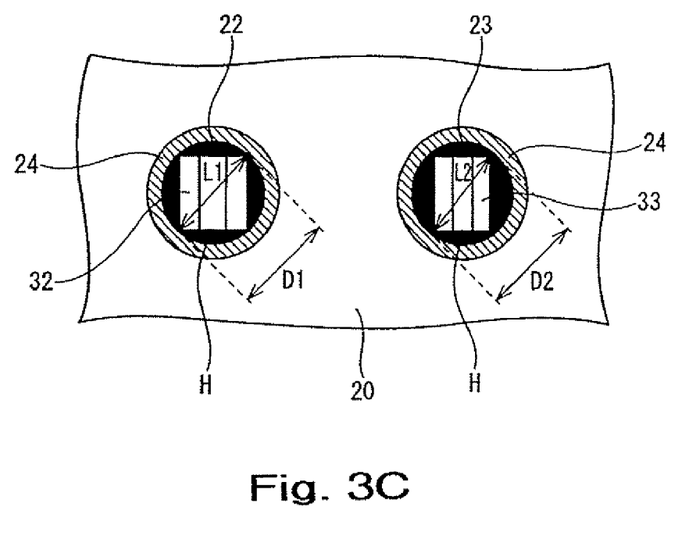
FIG. 3C is a bottom view illustrating the terminal soldered to the printed circuit board of the electric junction box of FIG. 1 in the direct-mount operation.

The plated through hole 22 has an inner diameter D1 such that the four corners of the first split solder portion 32 may be press fit in the through hole 22. Accordingly, the four corners of the first split solder portion 32 contact the inner surface of the through hole 22. More particularly, the inner diameter D1 of the through hole 22 is same as or substantially the same as a diagonal length L1 of the cross-section of the first split solder portion 32, as shown in FIG. 3C. An inner diameter D2 of the through hole 23 is same as or substantially the same as the inner diameter D1 of the through hole 22 and is larger than a diagonal length L2 of the cross-section of the second split solder portion 33, as shown in FIG. 3C. Accordingly, the four corners of the second split solder portion 33 do not contact the inner surface of the through hole 23.

To attach the terminal 30 to the printed circuit board 20, the two split solder portions 32 and 33 of the terminal 30 are first inserted into the through holes 22 and 23 in printed circuit board 20, respectively, as shown in FIG. 3A. As shown in FIG. 3C, the first split solder portion 32 is press-fit while contacting the inner circumferential surface of the through hole 22, and the second split solder portion 33 is loosely inserted without contacting the inner circumferential surface of the through hole 23. While the first split solder portion 32 is press-fit in the through hole 22 via the four corners of the first split solder portion 32, spaces exist between the four flat surfaces in cross-section of the first split solder portion 32 and the inner circumferential surface of the through hole 22, as shown in FIG. 3C. Thereby, the terminal 30 is positioned and held to the printed circuit board 20 by the press-fit of the first split solder portion 32 in the through hole 22. Then, as shown in FIGS. 3B and 3C, the spaces between the through holes 22 and 23 and the split solder portions 32 and 33, respectively, are filled with solder H, so that the split solder portions 32 and 33 are securely attached to the inner circumferential surface of the through holes 22 and 23, respectively, and are connected to the conductor 24.

A relay terminal 42 of a relay 41, which is inserted in a relay housing 40 provided on a top surface of the printed circuit board 20, is inserted and connected to the connecting terminal portion 34 that projects from the second end of the body 31 of the terminal 30.

In the electric junction box 10 of the present invention, which houses the printed circuit boards 20 directly mounted with the terminals 30 having the above described structure, the second split solder portion 33 of the terminal 30 is inserted and soldered without scratching the inner circumferential surface of the through hole 23, thus ensuring stable electric connectivity between the terminal 30 and the conductor 21 on the printed circuit board 20.

Further, the operation of manufacturing the electric junction box 10 of the present invention is an improvement of the prior art. More particularly, when the terminal 30 is soldered to the printed circuit board 20, the first split solder portion 32 of the terminal 30 is press-fit to the through hole 32 so as to position and fix the terminal 30 to the printed circuit board 20. Thereby, no jig or other holding device is required to press down and hold the terminal 30 as in a conventional method, thus preventing deformation and misalignment of the terminal 30 and eliminating alignment adjustment. Further, only one split solder portion 32 of the two split solder portions 32 and 33 is press-fit to a through hole, thus allowing insertion of the terminal 30 with a small insertion force and stabilizing the assembly.

Figure 4A:
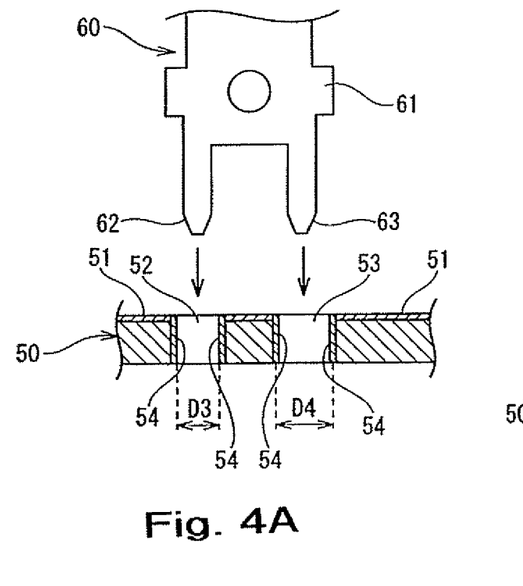
FIG. 4A is a cross-sectional view illustrating insertion of a terminal into a printed circuit board according to a second embodiment of the present invention.
Figure 4B:
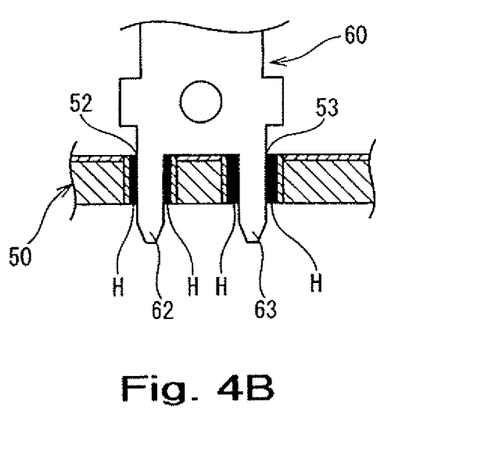
FIG. 4B is a cross-sectional view illustrating the terminal soldered to the printed circuit board according to the embodiment of FIG. 4A.
Figure 4C:
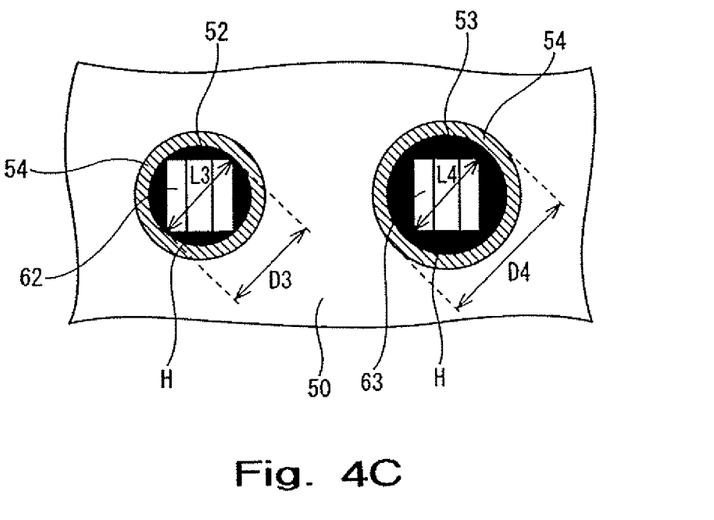
FIG. 4C is a bottom view illustrating the terminal soldered to the printed circuit board according to the embodiment of FIG. 4A.

FIGS. 4A to 4C show a construction for attaching a terminal 60 to a printed circuit board 50 according to a second embodiment of the present invention. The terminal 60 has a body 61 having a substantially rectangular planar shape. A first end portion of the body 61 is split into a first split solder portion 62 and a second split solder portion 63. The first and second split solder portions 62, 63 have substantially the same shape and project in parallel with a space therebetween. Similar to the terminal 30, the second end portion of the body 61 is provided with a pronged connecting terminal portion (not shown in the drawings) that projects in a direction opposite to the direction in which the split solder portions 62 and 63 project.

As shown in FIG. 4A, a conductor 51 is fixed along a circuit pattern on a surface of the printed circuit board 50. At a location for attaching the terminal 60 on the conductor 51, two through holes 52 and 53 are provided corresponding to the two split solder portions 62 and 63, respectively. Inner circumferential surfaces of the through holes 52 and 53 are plated with a conductor 54 connected to the conductor 51 on the printed circuit board 50, as shown in FIG. 4A.

The plated through hole 52 has an inner diameter D3 such that four corners of a first split solder portion 62 may be press fit in the through hole 52. More particularly, the inner diameter D3 of the through hole 52 is the same as or substantially the same as a diagonal length L3 of a cross-section of the first split solder portion 62, as shown in FIG. 4C. Accordingly, the four corners of the first split solder portion 62 contact the inner circumferential surface of the through hole 52. Further, the four flat surfaces in cross section of the first split solder portion 62 do not contact the inner circumferential surface of the through hole 52 such that spaces exist between the four flat surfaces in cross section of the first split solder portion 62 and the inner circumferential surface of the through hole 52. An inner diameter D4 of the through hole 53 is larger than the inner diameter D3 of the through hole 52, as shown in FIG. 4C. More particularly, the inner diameter D4 is larger than a diagonal length L4 of a cross-sectional shape of a second split solder portion 63, so that the second split solder portion 63 is loosely inserted without contacting the through hole 53. Further, in this second embodiment, the diagonal length L4 of the second split solder portion 63 is the same as or substantially the same as the diagonal length L3 of the first split solder portion 62.

To attach the terminal 60 to the printed circuit board 50, the two split solder portions 62 and 63 of the terminal 60 are first inserted into the through-holes 52 and 53, respectively, in the printed circuit board 50, as shown in FIG. 4A. As shown in FIG. 4C, the first split solder portion 62 is press-fit while contacting the inner circumferential surface of the through hole 52, having the smaller diameter, and the second split solder portion 63 is loosely inserted without contacting the inner circumferential surface of the through hole 53, having the larger diameter. Thereby, the terminal 60 is positioned and held to the printed circuit board 50 as the first split solder portion 62 is press-contacted to the through hole 52. Then, as shown in FIGS. 4B and 4C, spaces between the through holes 52 and 53 and the split solder portions 62 and 63, respectively, are filled with solder H, so that the split solder portions 62 and 63 are securely attached to the inner circumferential surface of the through holes 52 and 53, respectively, and are connected to the conductor 54.

In the above-described construction for attaching the terminal to the printed circuit board, even when a terminal 60 that includes split solder portions 62 and 63 having substantially the same size and shape is used, the split solder portion 63 loosely inserted into the through hole 53 having the large diameter ensures stable electric connectivity. Further, the split solder portion 62 press-fit to the through-hole 52 having the small diameter positions and fixes the terminal 60, thus eliminating use of a jig or other holding device, and preventing misalignment of the terminal 60.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. A terminal directly mounted on a printed circuit board by insertion in through holes in the printed circuit board, said terminal comprising:
   a solder portion inserted in through holes in the board, said solder portion being split into a plurality of portions;
   said plurality of portions comprising:
      a first split solder portion having a cross-sectional shape including four corners contacting an inner circumferential surface of a first through hole for positioning; and
      a second split solder portion having a cross-sectional shape such that said second split solder portion is loosely inserted in a second through hole without contacting an inner circumferential surface of the through hole.

2. The terminal directly mounted on a printed circuit board according to claim 1, further comprising:
   solder filled in the first through hole and fixing said first split solder portion to the inner circumferential surface of said first through hole; and
   solder filled in the second through hole and fixing said second split solder portion to the inner circumferential surface of said second through hole.

3. The terminal directly mounted on a printed circuit board according to claim 1:
   said first through hole having a first diameter and said second through hole having a second diameter substantially equal to the first diameter; and
   said first split solder portion being positioned and held in said first through hole by said four corners contacting the inner circumferential surface of the first through hole; and
   said second split solder portion being spaced from and not contacting the inner circumferential surface of the second through hole.

4. The terminal directly mounted on a printed circuit board according to claim 1:
   said second split solder portion having a cross-sectional shape substantially the same as the shape of said first split solder portion;
   said first through hole having a first diameter such that said four corners of said first split solder portion contact the inner circumferential surface of said first through hole for positioning; and
   said second through hole having a second diameter greater than said first diameter such that said second split solder portion is loosely inserted in said second through hole and does not contact the inner circumferential surface of the second through hole.

5. The terminal directly mounted on a printed circuit board according to claim 1:
   said first split solder portion being press fit in said first through hole.

6. The terminal directly mounted on a printed circuit board according to claim 3:
   a diagonal length of the cross-section of said first solder portion being substantially equal to said first diameter of the first through hole; and
   said diagonal length of the cross-section of said first solder portion being greater than a diagonal length of the cross-section of said second solder portion.

7. The terminal directly mounted on a printed circuit board according to claim 4:
   a diagonal length of the cross-section of said first solder portion being substantially equal to said first diameter of the first through hole; and
   said diagonal length of the cross-section of said first solder portion being substantially equal to a diagonal length of the cross-section of said second solder portion.

8. A connection for directly mounting a terminal on a printed circuit board by insertion in through holes in the printed circuit board, said connection comprising:
   a terminal solder portion inserted in through holes in the board, said solder portion being split into a plurality of portions;
   said plurality of portions comprising:
      a first split solder portion having a cross-sectional shape including four corners contacting an inner circumferential surface of a first through hole for positioning; and
      a second split solder portion having a cross-sectional shape such that said second split solder portion is loosely inserted in a second through hole without contacting an inner circumferential surface of the second through hole.

9. The connection for directly mounting a terminal on a printed circuit board according to claim 8, further comprising:
   solder filled in the first through hole and fixing said first split solder portion to the inner circumferential surface of said first through hole; and
   solder filled in the second through hole and fixing said second split solder portion to the inner circumferential surface of said second through hole.

10. The connection for directly mounting a terminal on a printed circuit board according to claim 8:
    said first through hole having a first diameter and said second through hole having a second diameter substantially equal to the first diameter; and
    said first split solder portion being positioned and held in said first through hole by said four corners contacting the inner circumferential surface of the first through hole; and
    said second split solder portion being spaced from and not contacting the inner circumferential surface of the second through hole.

11. The connection for directly mounting a terminal on a printed circuit board according to claim 8:

said second split solder portion having a cross-sectional shape substantially the same as the shape of said first split solder portion;

said first through hole having a first diameter such that said four corners of said first split solder portion contact the inner circumferential surface of said first through hole for positioning; and said second through hole having a second diameter greater than said first diameter such that said second split solder portion is loosely inserted in said second through hole and does not contact the inner circumferential surface of the second through hole.

12. In combination, an electrical junction box; and
a terminal directly mounted on a printed circuit board according to claim 1.

13. The connection for directly mounting a terminal on a printed circuit board according to claim 8:

said first split solder portion being press fit in said first through hole.

14. The connection for directly mounting a terminal on a printed circuit board according to claim 10:

a diagonal length of the cross-section of said first solder portion being substantially equal to said first diameter of the first through hole; and said diagonal length of the cross-section of said first solder portion being greater than a diagonal length of the cross-section of said second solder portion.

15. The connection for directly mounting a terminal on a printed circuit board according to claim 11:

a diagonal length of the cross-section of said first solder portion being substantially equal to said first diameter of the first through hole; and said diagonal length of the cross-section of said first solder portion being substantially equal to a diagonal length of the cross-section of said second solder portion.

16. A method of directly mounting a terminal on a printed circuit board by insertion in through holes in the printed circuit board, said method comprising:

providing a terminal solder portion to be inserted in through holes in the board, said solder portion being split into a plurality of portions;

said plurality of portions comprising:

a first split solder portion having a cross-sectional shape including four corners configured to contact an inner circumferential surface of a first through hole for positioning; and a second split solder portion having a cross-sectional shape configured to be loosely inserted in a second through hole without contacting an inner circumferential surface of the second through hole;

inserting said first split solder portion in said first through hole such that said first split solder portion is positioned and held in said first through hole by the four corners contacting the inner circumferential surface of the first through hole; and inserting said second split solder portion in said second through hole such that said second split solder portion does not contact the inner circumferential surface of the second through hole.

17. The method of directly mounting a terminal on a printed circuit board according to claim 16, further comprising:

filling said first through hole with solder and fixing said first split solder portion to the inner circumferential surface of said first through hole; and filling said second through hole with solder and fixing said second split solder portion to the inner circumferential surface of said second through hole.

18. The method of directly mounting a terminal on a printed circuit board according to claim 16, comprising:

providing said first through hole having a first diameter and said second through hole having a second diameter substantially equal to the first diameter.

19. The method of directly mounting a terminal on a printed circuit board according to claim 16, comprising:

providing said second split solder portion having a cross-sectional shape substantially the same as the shape of said first split solder portion; and providing said first through hole having a first diameter such that the four corners of said first split solder portion contact the inner circumferential surface of said first through hole for positioning; and providing said second through hole having a second diameter greater than said first diameter such that said second split solder portion is loosely inserted in said second through hole and does not contact the inner circumferential surface of the second through hole.

20. The method of directly mounting a terminal on a printed circuit board according to claim 16, further comprising:

providing an electric junction box; and housing the terminal directly mounted on the printed circuit board in the electric junction box.

* * * * *